US008753968B2

(12) United States Patent
Huang et al.

(10) Patent No.: US 8,753,968 B2
(45) Date of Patent: Jun. 17, 2014

(54) METAL GATE PROCESS

(75) Inventors: Kuang-Hung Huang, Tainan (TW); Po-Jui Liao, Taichung (TW); Yao-Chang Wang, Tainan (TW); Chi-Sheng Tseng, Kaohsiung (TW); Jie-Ning Yang, Ping-Tung County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/279,355

(22) Filed: Oct. 24, 2011

(65) Prior Publication Data

US 2013/0102145 A1 Apr. 25, 2013

(51) Int. Cl.
*H01L 21/28* (2006.01)

(52) U.S. Cl.
USPC ........... 438/595; 257/758; 257/380; 257/529; 257/538; 257/379; 438/381; 438/238; 438/589; 438/584; 438/479

(58) Field of Classification Search
USPC .......... 257/758, 380, 529, 538, 379; 438/595, 438/381, 238, 589, 584, 479
See application file for complete search history.

(56) References Cited

U.S. PATENT DOCUMENTS 5,152,834 A * 10/1992 Allman .................... 106/287.13
6,964,893 B2 * 11/2005 Matsuo ......................... 438/199
7,126,199 B2 * 10/2006 Doczy et al. .................. 257/412
7,227,228 B2 * 6/2007 Kohyama ...................... 257/347
7,538,018 B2 * 5/2009 Chien ........................... 438/595
7,671,471 B2 * 3/2010 Brask et al. ................... 257/750
8,048,810 B2 * 11/2011 Tsai et al. ..................... 438/703
8,193,081 B2 * 6/2012 Lim et al. ...................... 438/589
2006/0017165 A1 * 1/2006 Ni et al. ........................ 257/754
2007/0190767 A1 * 8/2007 Nakamura et al. ............ 438/592
2007/0262451 A1 * 11/2007 Rachmady et al. ........... 257/758
2010/0081262 A1 * 4/2010 Lim et al. ...................... 438/479
2010/0124818 A1 * 5/2010 Lee et al. ...................... 438/589
2011/0057267 A1 * 3/2011 Chuang et al. ................ 257/380
2011/0081774 A1 * 4/2011 Yeh et al. ...................... 438/591
2011/0151655 A1 * 6/2011 Chan et al. .................... 438/589

OTHER PUBLICATIONS

Pong-Wey Huang, Title of Invention: Semiconductor Process, U.S. Appl. No. 13/248,011, filed Sep. 28, 2011.

* cited by examiner

*Primary Examiner* — Lex Malsawma
*Assistant Examiner* — Sheng Zhu
(74) *Attorney, Agent, or Firm* — Winston Hsu; Scott Margo

(57) ABSTRACT

A metal gate process includes the following steps. An isolating layer on a substrate is provided, where the isolating layer has a first recess and a second recess. A first metal layer covering the first recess and the second recess is formed. A material is filled in the first recess but exposing a top part of the first recess. The first metal layer in the top part of the first recess and in the second recess is simultaneously removed. The material is removed. A second metal layer and a metal gate layer in the first recess and the second recess are sequentially filled.

20 Claims, 5 Drawing Sheets

METAL GATE PROCESS

BACKGROUND OF THE INVENTION

1. Field of the Invention

The present invention relates generally to a metal gate process, and more specifically, to a metal gate process, which removes a metal layer in at least two recesses.

2. Description of the Prior Art

Poly-silicon is conventionally used as a gate electrode in semiconductor devices, such as the metal-oxide-semiconductor (MOS). With the trend towards scaling down the size of semiconductor devices, conventional poly-silicon gates face problems such as inferior performance due to boron penetration and unavoidable depletion effect. This increases equivalent thickness of the gate dielectric layer, reduces gate capacitance, and worsens a driving force of the devices. Therefore, work function metals that are suitable for use as the high-K gate dielectric layer are used to replace the conventional poly-silicon gate to be the control electrode.

SUMMARY OF THE INVENTION

The present invention provides a metal gate process, which removes a metal layer in a top part of one recess and in the other recesses simultaneously.

The present invention provides a metal gate process including the following steps. An isolating layer on a substrate is provided, wherein the isolating layer has a first recess and a second recess. A first metal layer covering the first recess and the second recess is formed. A material is filled in the first recess but exposing a top part of the first recess. The first metal layer in the top part of the first recess and in the second recess is simultaneously removed. The material is removed. A second metal layer and a metal gate layer in the first recess and the second recess are sequentially filled.

The present invention provides a metal gate process, which removes a metal layer in a top part of one recess and in the other recesses simultaneously by performing one time of a lithography process. Thus, voids between two transistors caused by misaligned photoresists formed during twice lithography processes can be avoided, so that the material of a metal gate layer will not remain in the voids, therefore the problem of the metal gate material residue can be resolved in the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
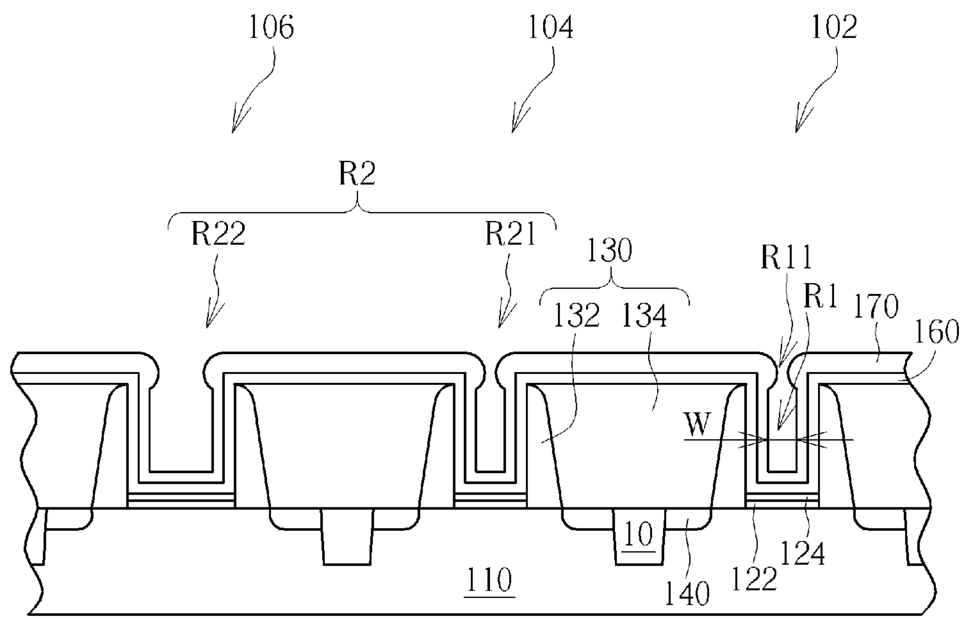
FIGS. 1-3 schematically depict a cross-sectional view of a metal gate process according to the first embodiment of the present invention.
Figure 2:
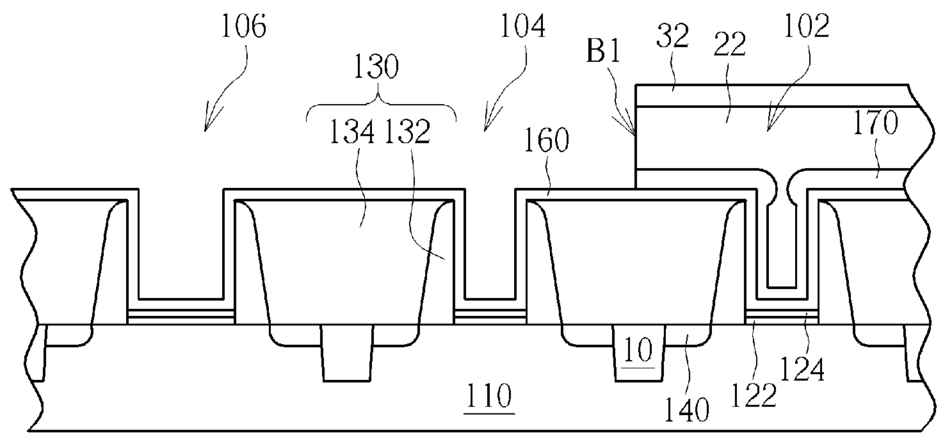
Figure 3:
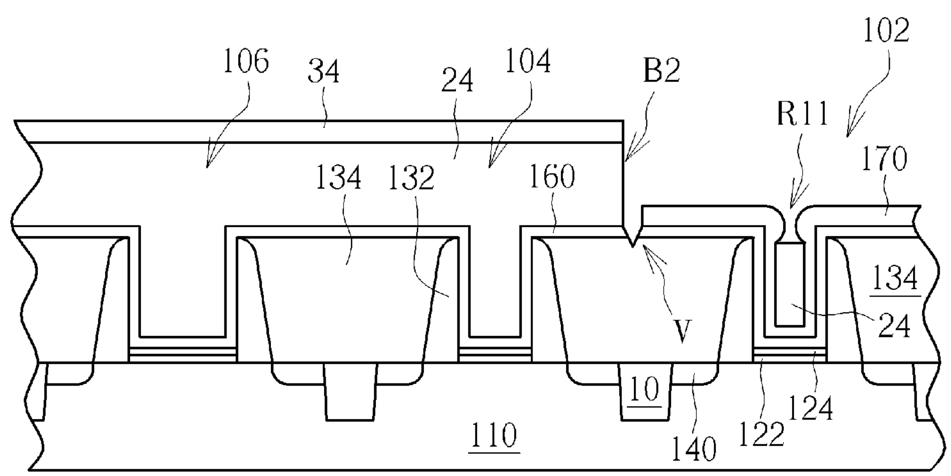

FIGS. 1-3 schematically depict a cross-sectional view of a metal gate process according to the first embodiment of the present invention. As shown in FIG. 1, a shallow trench isolation layer 10 is formed in the substrate 110 by methods such as shallow trench isolation technologies. A buffer layer (not shown), a dielectric layer having a high dielectric constant (not shown), a sacrificial gate layer (not shown) and a cap layer (not shown) are sequentially formed on the substrate 110. The cap layer (not shown), the sacrificial gate layer (not shown), the dielectric layer having a high dielectric constant (not shown) and the buffer layer (not shown) are sequentially patterned to form a buffer layer 122, a dielectric layer 124 having a high dielectric constant, a sacrificial gate layer (not shown) and a cap layer (not shown), thereby a dummy gate is formed. A spacer 132 is formed beside the dummy gate. A source/drain region 140 is formed in the substrate 110 beside the spacer 132 by implanting or by in-situ doping in epitaxial growth. An interdielectric layer 134 and a contact etching stop layer (not shown) are formed on the substrate 110. The interdielectric layer 134 is planarized by methods such as a polishing process and the cap layer (not shown) is also removed to expose the sacrificial gate layer (not shown). The sacrificial gate layer (not shown) is etched and removed, and then a first recess R1 and a second recess R2 including the smaller recess R21 and the larger recess R22 are formed. The steps of the gate-last for high-k first process are known in the art, and are not described in detail.

A bottom barrier layer (not shown) such as a titanium nitride layer may be selectively formed between the dielectric layer 124 having a high dielectric constant and the sacrificial gate layer (not shown) to avoid the dielectric layer 124 having a high dielectric constant from being damaged while the sacrificial gate layer (not shown) is removed. In this embodiment, the recess R1 is used to form a metal gate of a PMOS transistor 102, the smaller recess R21 is used to form a metal gate of an NMOS transistor 104, and the larger recess R22 is used to form a metal gate of a high-voltage transistor 106. Therefore, the size of the recess R1 is in the same level with the size of the smaller recess R21, and the size of the larger recess R22 is larger than the size of the recess R1 and the smaller recess R21. In another embodiment, the first recess R1 and the second recess R2 may be used as other semiconductor components and the sizes of the first recess R1 the second recess R2 depend upon these semiconductor components. The numbers of the first recess R1 and the second recess R2 shown in figures are just one case of applying the present invention, and the present invention is not limited thereto.

A barrier layer 160 is selectively formed on the dielectric layer 124 having a high dielectric constant, wherein the barrier layer 160 may be a single layer structure or a multilayer structure composed of tantalum nitride (TaN), titanium nitride (TiN), etc. In this embodiment, the barrier layer 160 is a tantalum nitride layer. A first metal layer 170 is formed and covers the barrier layer 160 for being a work function metal layer. In this embodiment, the first metal layer 170 is a titanium nitride layer for using as a work function metal of the PMOS transistor 102, but it is not limited thereto.

As shown in FIG. 2, a first photolithography process is performed to etch the first metal layer 170 in the NMOS transistor 104 and in the high-voltage transistor 106, but keep the first metal layer 170 in the PMOS transistor 102. For instance, a material 22 is filled over the first recess R1 and the second recess R2, and covers the first metal layer 170. A photoresist 32 is formed on the material 22. The photoresist 32 and the material 22 are sequentially patterned to expose the first metal layer 170 in the NMOS transistor 104 and in the high-voltage transistor 106. The first metal layer 170 in the NMOS transistor 104 and in the high-voltage transistor 106 is removed by methods such as an etching process. Then, the photoresist 32 and the material 22 are sequentially removed.

As shown in FIG. 3, a second photolithography process is performed to etch the first metal layer 170 in the top part R11 of the recess R1 and outside the recess R1 for removing the overhang of the first metal layer 170 in the recess R1 of the PMOS transistor 102. For instance, a material 24 is filled over the first recess R1 and the second recess R2 and on the first metal layer 170 or the barrier layer 160. A photoresist 34 is formed on the material 24. The photoresist 34 and the material 24 are sequentially patterned to expose the first metal layer 170 in the top part R11 of the recess R1. The first metal layer 170 in the PMOS transistor 102 is removed by methods such as an etching process. Then, the photoresist 34 and the material 24 are sequentially removed.

In this embodiment, the first metal layer 170 in the top part R11 of the recess R1, in the NMOS transistor 104 and in the high-voltage transistor 106 are removed by two photoresist processes. However, the boundary B1 (as shown in FIG. 2) of the photoresist 32 and the material 22, and the boundary B2 (as shown in FIG. 3) of the photoresist 34 and the material 24 may not be overlapped, resulting in a void V generated in the interdielectric layer 134 and the barrier layer 160 between the boundaries B1 and B2, and the material of a metal gate such as aluminum would therefore remain after the metal gate is formed.

FIGS. 4-10 schematically depict a cross-sectional view of a metal gate process according to the second embodiment of the present invention. As shown in FIG. 1 firstly, an isolating layer 130 is provided on a substrate 110. The isolating layer 130 may include spacers 132, an interdielectric layer 134, and a contact etching stop layer (not shown). The isolating layer 130 has a first recess R1 and a second recess R2 including a smaller recess R21 and the larger recess R22. A buffer layer 122 and a dielectric layer 124 are respectively located in the bottom of the first recess R1 and the second recess R2, wherein the buffer layer 122 may be an oxide layer formed by methods such as a thermal oxide process, a chemical oxide process, etc., and the dielectric layer 124 may be a dielectric layer having a high dielectric constant. A bottom barrier layer (not shown) is selectively formed on the dielectric layer 124, wherein the bottom barrier layer (not shown) may be a single layer or a multilayer composed of titanium nitride or tantalum nitride. In this embodiment, the bottom barrier layer (not shown) is a titanium nitride layer. A barrier layer 160 is formed and covers the first recess R1 and the second recess R2. In this embodiment, the barrier layer 160 is a tantalum layer, but it may be a single layer or a multilayer composed of titanium nitride or tantalum nitride in another embodiment. A first metal layer 170 is formed and covers the first recess R1 and the second recess R2. The first metal layer 170 may be a work function layer. In this case, the first metal layer 170 is a titanium nitride layer suited for a PMOS transistor 102, but it is not limited thereto. The steps of forming the structure of FIG. 1 are described in the last embodiment, and are not described again. The gate-last for high-k first process is applied in the present invention. In addition, a gate-last for high-k last process may also be applied in the present invention.

In this embodiment, the smaller recess R21 is in the same level with the first recess R1, and the size of the larger recess R22 is larger than the size of the recess R1 and the smaller recess R21. In another embodiment, the first recess R1 and the second recess R2 may be used as other semiconductor components and the sizes of the first recess R1 the second recess R2 depend upon these semiconductor components. The numbers of the first recess R1 the second recess R2 shown in figures are just one case of applying the present invention, but it is not limited thereto. In this case, the width w of the first recess R1 is smaller than 0.3 um. Thus, the overhang of the first metal layer 170 in a top part R11 of the recess R1 will lead to the material of the sequentially formed metal gate layer being difficult to fill into the first recess R1.

Figure 4:
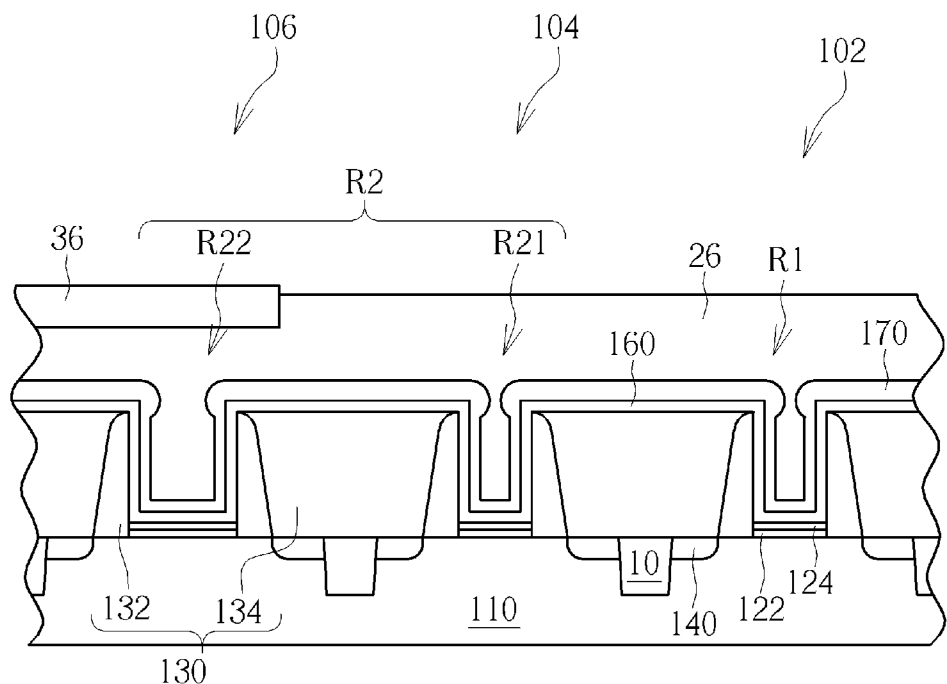
FIGS. 4-10 schematically depict a cross-sectional view of a metal gate process according to the second embodiment of the present invention.
Figure 5:
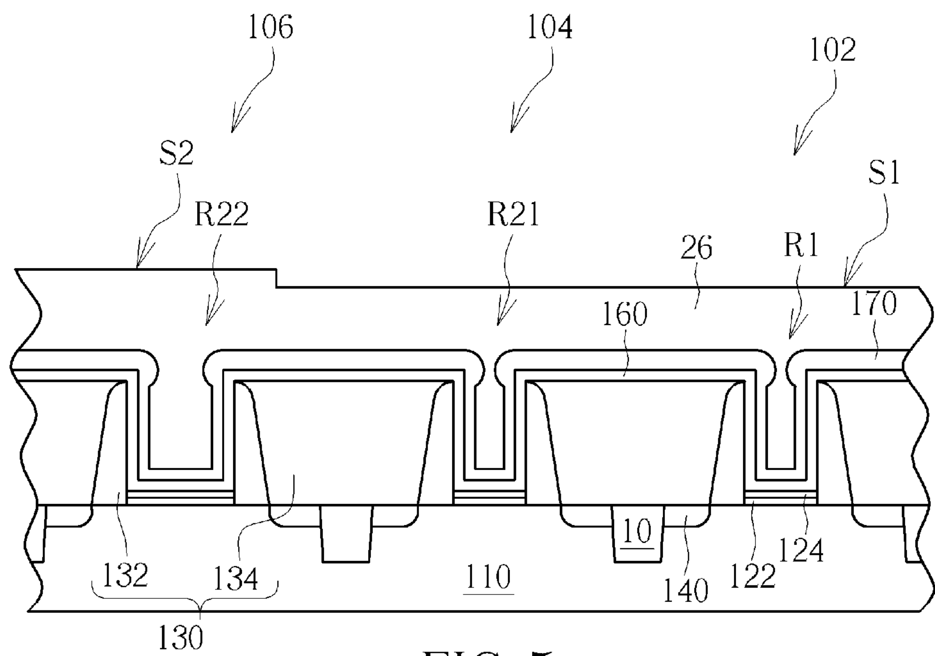

As shown in FIGS. 4-5, a loading improvement process is performed. For example, the loading improvement process is performed to solve the problem that occurs because of the difference in larger recesses and smaller recesses; or in an isolated region and a dense region. As shown in FIG. 4, a material 26 is filled over the first recess R1 and the second recess R2. The material 26 may comprise silicon and carbon. For example, the material 26 may be deep ultraviolet light absorbing oxide (DUO) materials, or other suitable materials. A photoresist 36 is formed and patterned to cover the material 26 on the larger recess R22 and expose the material 26 on the smaller recess R21 and the first recess R1. As shown in FIG. 5, part of the material 26 on the smaller recess R21 and the first recess R1 is etched, so that the top surface S1 of the material 26 on the smaller recess R21 and the first recess R1 can be higher than the top surface S2 of the material 26 on the larger recess R22. Then, the photoresist 36 is removed by methods such as a dry etching process, an $O_2$ stripping process, etc.

Figure 6:
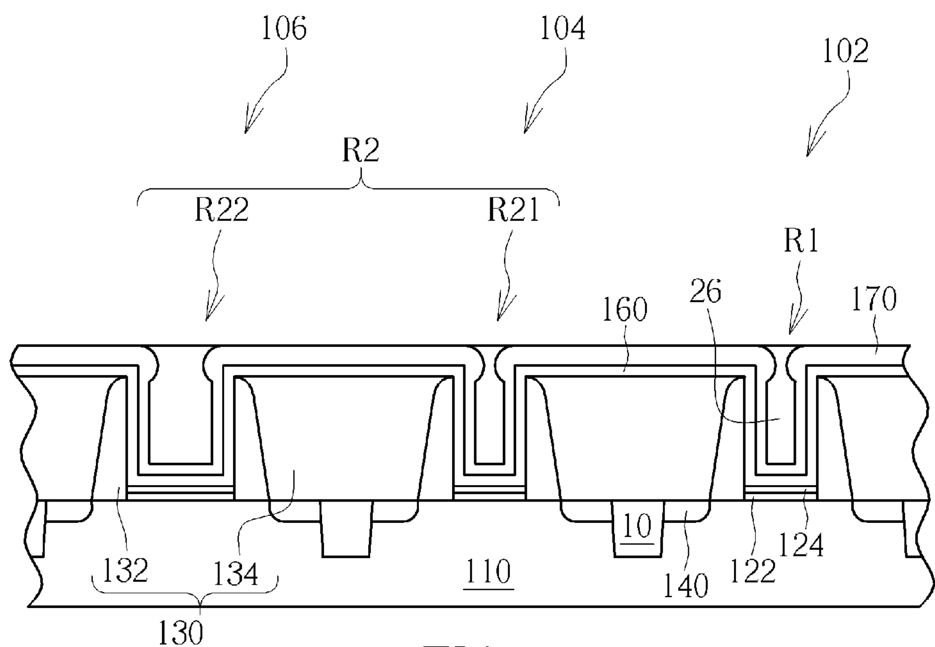

As shown in FIG. 6, the material 26 is removed by methods such as an etching back process until the material 26 is flush with the top of the first metal layer 170. The methods of removing the material 26 may be a wet etching process such as using an end point detection (EPD) etching, Ethylene Diamine Pyrocatechol (EDP) etchant, etc. It is worthy of noting that the material 26 can be removed and flush with the top of the first metal layer 170 because of the loading improvement process (shown in FIGS. 4-5) is performed. The etching rate of the etching back process etching the material 26 filled into different sizes of recesses is different, so the loading improvement process is performed to etch part of the material 26 on smaller recesses firstly and then the material 26 can be flat and flush with the first metal layer 170.

Figure 7:
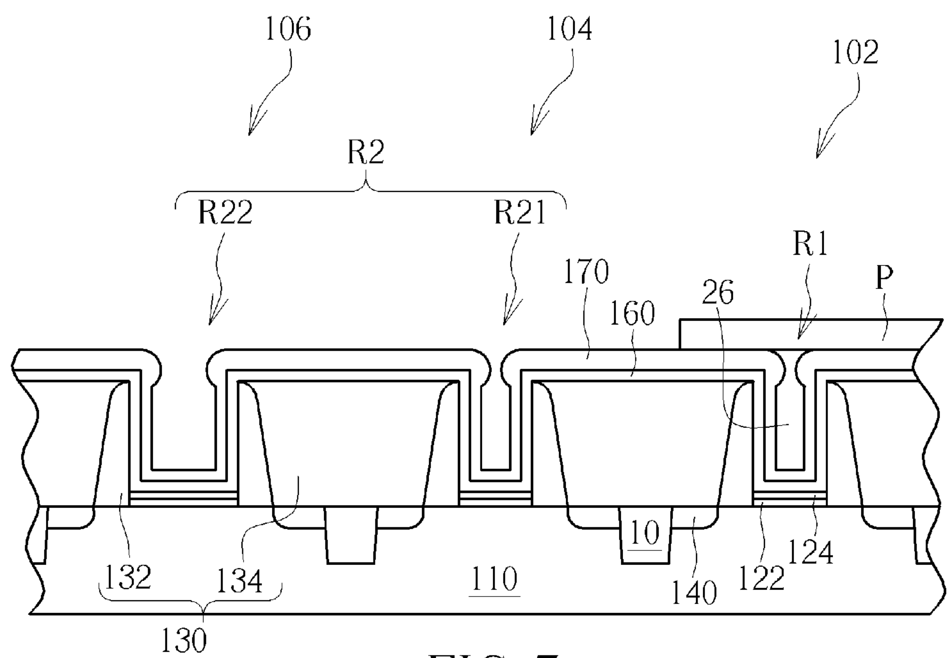

As shown in FIG. 7, after the material 26 is filled in the first recess R1 and the second recess R2 (the material 26 is flush with the first metal layer 170 preferably), a mask P is formed and patterned to located on the first recess R1. The material 26 in the second recess R2 is removed by using the mask P as a mask. Then, the mask P is removed, wherein the mask P may be removed by an $O_2$ stripping process. In this case, the material 26 may be removed by performing a photolithography process and the mask P is therefore a photoresist, but it is not limited thereto.

Figure 8:
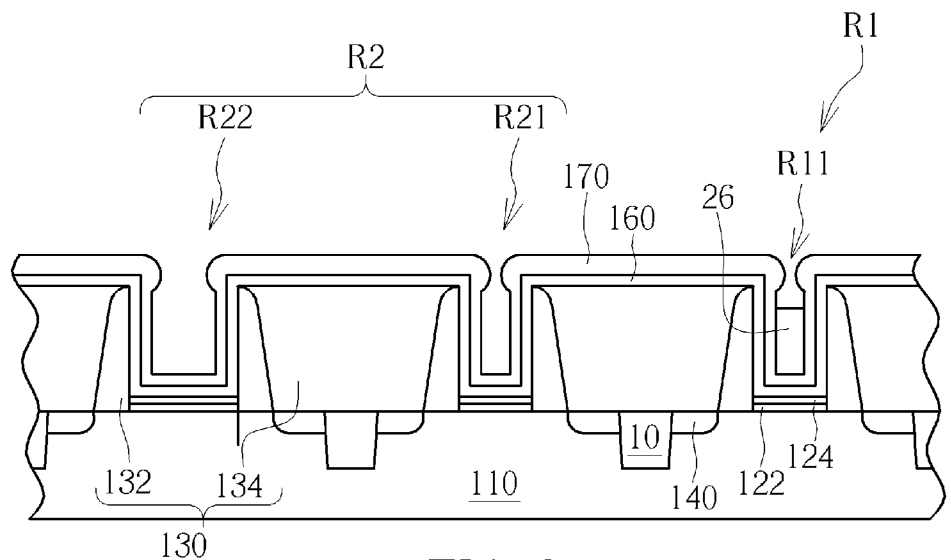

As shown in FIG. 8, the material 26 remaining in the first recess R1 is pulled down to expose the top part R11 of the first recess R1. The material 26 may be pulled down by a nitrogen, hydrogen, and tetrafluoromethane containing wet etching process. Preferably, the nitrogen, hydrogen, and tetrafluoromethane containing wet etching process is performed for about 14 seconds. In another case, the material 26 may be filled in the first recess R1 but exposing a top part R11 of the first recess R1 by other methods.

Figure 9:
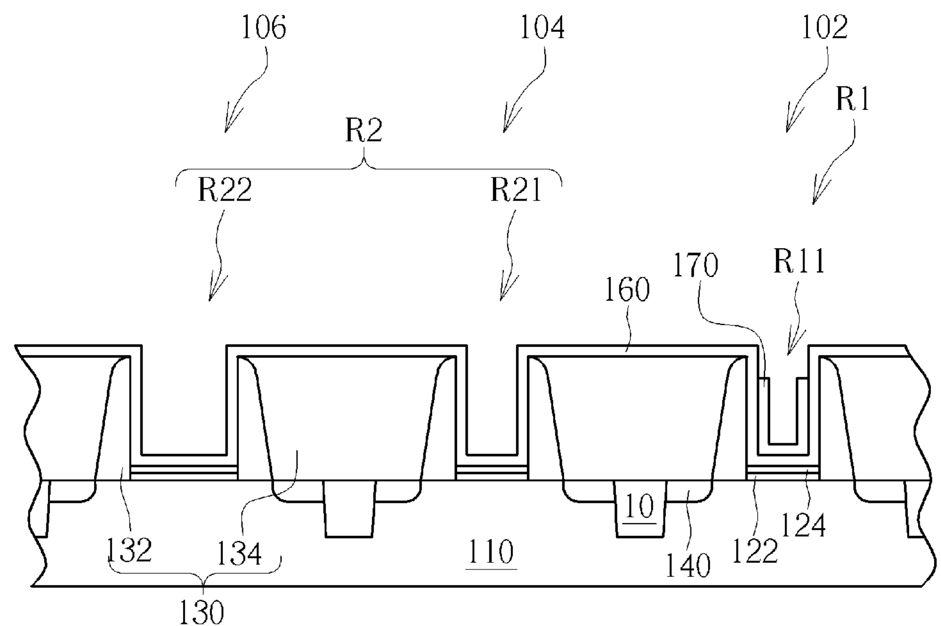

As shown in FIG. 9, the first metal layer 170 in the top part R11 of the first recess R1 and in the second recess R2 are simultaneously removed, wherein the first metal layer 170 may be removed by a Standard Clean 1 (SC1) process, or other suitable processes. Then, the material 26 remaining in the first recess R1 is removed.

Figure 10:
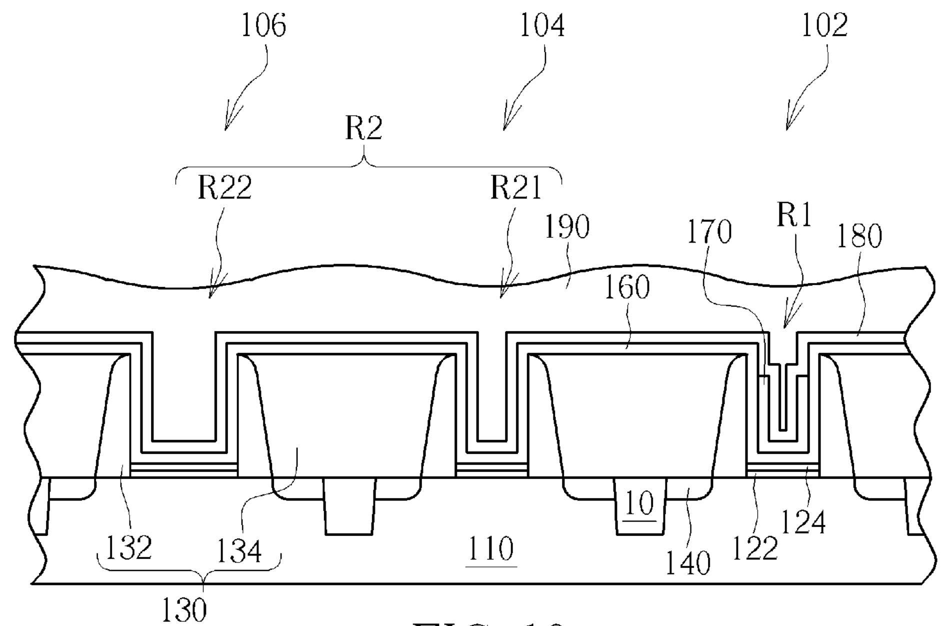

As shown in FIG. 10, a second metal layer 180, a top barrier layer (not shown) and a metal gate layer 190 are sequentially filled in and over the first recess R1 and the second recess R2. In this embodiment, the second metal layer 180 is a work function metal layer suited for the NMOS transistor 104. For example, the second metal layer 180 may be an aluminum titanium layer, but it is not limited thereto. Thereafter, the metal gate layer 190, the second metal layer 180 and the barrier layer 160 are planarized, and the metal gates (not shown) of the PMOS transistor 102, the NMOS transistor 104 and the high voltage transistor 106 are therefore formed.

Above all, the present invention provides a metal gate process, which removes a metal layer in the top part of the first recess and in the second recess simultaneously by performing a lithography process once. Thus, the void between the PMOS transistor and the NMOS transistor caused by the misaligned photoresists in twice performing lithography processes can be avoided, so that the material of the metal gate layer will not remain in the void and the problem of the metal gate layer residue can be solved in the present invention.

Furthermore, the loading improvement process, which etches part of the material on the first recess and the smaller recesses, is performed in the present invention, so that the material can be flat and flush with the first metal layer in every recess after being partially removed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A metal gate process, comprising:

providing an isolating layer on a substrate, wherein the isolating layer has a first recess and a second recess;

forming a first metal layer covering the first recess and the second recess;

only filling a material in the first recess but exposing a top part of the first recess;

simultaneously removing the first metal layer in the top part of the first recess and in the whole second recess;

removing the material; and sequentially filling a second metal layer and a metal gate layer in the first recess and the second recess.

2. The metal gate process according to claim 1, wherein the isolating layer comprises spacers surrounding and defining the first recess and the second recess and an interdielectric layer between the spacers.

3. The metal gate process according to claim 1, wherein the first metal layer and the second metal layer comprise work function metal layers.

4. The metal gate process according to claim 3, wherein the first metal layer is suited for a PMOS transistor and the second metal layer is suited for an NMOS transistor.

5. The metal gate process according to claim 4, wherein the first metal layer comprises a titanium nitride layer.

6. The metal gate process according to claim 4, wherein the second metal layer comprises an aluminum titanium layer.

7. The metal gate process according to claim 1, wherein the material comprises silicon and carbon.

8. The metal gate process according to claim 7, wherein the material comprises deep ultraviolet light absorbing oxide (DUO) materials.

9. The metal gate process according to claim 1, further comprising a dielectric layer respectively formed in the bottom of the first recess and the second recess.

10. The metal gate process according to claim 1, wherein before forming the first metal layer covering the first recess and the second recess, the method further comprises forming a barrier layer covering the first recess and the second recess.

11. The metal gate process according to claim 1, wherein the first metal layer in the top part of the first recess and in the second recess are simultaneously removed by a Standard Clean 1 (SC1) process.

12. The metal gate process according to claim 1, wherein the width of the first recess is smaller than 0.3 um.

13. The metal gate process according to claim 1, wherein the steps of filling the material in the first recess but exposing a top part of the first recess comprise:

filling the material in the first recess and the second recess;

forming a mask on the first recess;

removing the material in the second recess; and removing the mask.

14. The metal gate process according to claim 13, wherein the mask is removed by an O2 stripping process.

15. The metal gate process according to claim 13, wherein the material filled in the first recess and the second recess is flush with the top of the first metal layer.

16. The metal gate process according to claim 13, wherein after removing the mask, further comprises pulling down the material in the first recess to expose the top part of the first recess.

17. The metal gate process according to claim 16, wherein the material is pulled down by a nitrogen, hydrogen, and tetrafluoromethane containing wet etching process.

18. The metal gate process according to claim 17, wherein the nitrogen, hydrogen, and tetrafluoromethane containing wet etching process is performed for about 14 seconds.

19. The metal gate process according to claim 15, wherein the second recess further comprises a larger recess and a smaller recess, wherein the smaller recess is in the same level with the first recess.

20. The metal gate process according to claim 19, wherein the steps of filling the material in the first recess and the second recess comprise:

filling the material over the first recess and the second recess;

forming a photoresist to cover the material on the larger recess and expose the material on the smaller recess and the first recess;

etching part of the material on the smaller recess and the first recess;

removing the photoresist; and removing the material until the material is flush with the top of the first metal layer.

* * * * *